United States Patent [19]

Suemitsu et al.

[11] Patent Number: 4,609,259

[45] Date of Patent: Sep. 2, 1986

[54] PROCESS FOR PRODUCING MICRO FRESNEL LENS

[75] Inventors: Takashi Suemitsu; Shinichi Suzuki; Takashi Niriki, all of Yamanashi, Japan

[73] Assignee: Pioneer Electronic Corporation, Tokyo, Japan

[21] Appl. No.: 669,792

[22] Filed: Nov. 9, 1984

[30] Foreign Application Priority Data

Nov. 11, 1983 [JP] Japan ................. 58-210765

[51] Int. Cl.$^4$ ................................. G02B 3/08
[52] U.S. Cl. ................. 350/417; 350/162.16; 350/320
[58] Field of Search ............ 350/320, 417, 162.16; 156/904; 430/942, 296

[56] References Cited

U.S. PATENT DOCUMENTS 3,948,660 4/1976 Deml et al. ................. 350/417

OTHER PUBLICATIONS

Optics Communications, vol. 6, No. 2 (Oct. 1972) by J. J. Clair.

Optics Communications, vol. 5, No. 4 (Jul. 1972) by L. d'Auria, J. P. Huignard, A. M. Roy and E. Spitz.

*Primary Examiner*—John K. Corbin
*Assistant Examiner*—Loha Ben
*Attorney, Agent, or Firm*—Finnegan, Henderson, Farabow, Garrett & Dunner

[57] ABSTRACT

A process for producing a micro Fresnel lens comprises the following steps: moving either a substrate coated with a resist layer for providing the micro Fresnel lens or a source of actinic radiation such as electron beam for exposing the resist layer relative to each other in a fixed direction; scanning linearly the resist coat with the actinic radiation in a direction perpendicular to the direction of the relative movement; during the scanning operation, performing exposure to the actinic radiation or interrupting or overlapping the application of the actinic radiation so as to form a latent image in an area corresponding to the grooved surface of the micro Fresnel lens within a predetermined width; repeating the above procedures in a direction perpendicular to that of the relative movement of the substrate and the source of actinic radiation; and developing the exposed resist layer to provide a micro Fresnel lens having the desired grooved surface.

4 Claims, 14 Drawing Figures

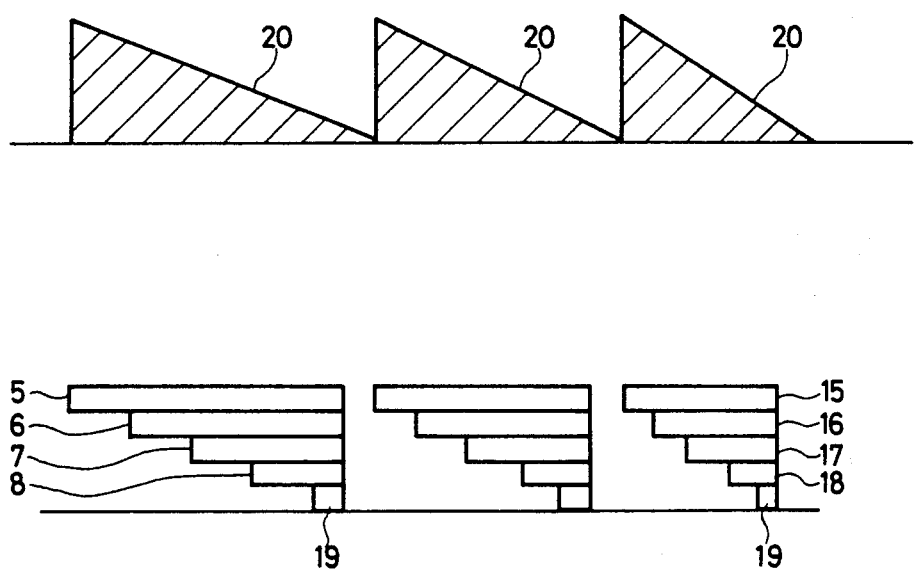

PROCESS FOR PRODUCING MICRO FRESNEL LENS

BACKGROUND OF THE INVENTION

The present invention relates to a process for producing a micro Fresnel lens (also known as a Fresnel zone plate) by exposure to actinic radiation such as electron beam, laser light or UV rays, and by subsequent development.

The micro Fresnel lens is a non-classical lens that is designed to have the optical properties such as light concentration by making use of diffraction. As shown in FIGS. 1 to 3, the micro Fresnel lens has concentric rings on a flat surface, and each ring has a rectangular cross section 1 or a sawtoothed cross section 2. A micro Fresnel lens having sawtoothed concentric rings 2 has a higher light concentration efficiency than a lens using rectangular concentric rings 1.

The conventional method of fabricating the micro Fresnel lens proceeds in the following manner. As shown in FIG. 4, a transparent blank such as a glass or acrylic resin plate that has been polished to a flat surface is coated with a resist layer 4, thereby providing a substrate A. An electron beam 5 is focused on the resist layer 4 and deflected in a circular pattern to scan the resist layer 4 for exposure.

Ideally, a sawtoothed setback 2 formed on the micro Fresnel lens should have the shape shown in FIG. 5(A), and this idealized shape can only be obtained by repeating the application of electron beam 5 to the same area of the resist layer. To this end, as shown in FIG. 5(B), the area corresponding to the highest point a of the sawtooth is scanned once, the area corresponding to the second highest point b is scanned twice, the area corresponding to point c is scanned three times, and the area corresponding to the lowest point d is given four scannings. By applying varying exposures or doses of electron beam to different areas, the thickness of resist layer 6 that is left intact after development can be varied in the respective areas.

In actuality, owing to the difference in intensity across an electron beam spot and the difference in exposure width, the setback remaining after development assumes the shape shown in FIG. 5(C) which is less like a staircase but more like the ideal sawtoothed shape.

In the conventional fabrication method using an electron beam as actinic radiation which describes a circularly deflected scanning pattern, a very large deflection angle cannot be employed and the widest area that can be exposed is only 1 to 2 millimeters across. It is therefore impossible to prepare a pattern of concentric rings for a large-diameter lens. Another disadvantage occurs when a plurality of patterns must be formed on a single substrate. After one pattern is formed by circularly deflected scanning, the substrate is moved a predetermined distance for receiving the scanning radiation to form the next pattern. This step-and-repeat process is unable to effect continuous movement of the substrate and requires a prolonged time in exposing the entire area of the resist layer. Furthermore, the circularly deflected scanning is not highly adaptive to the current practice of using a modified electron microscope as an electron beam scanner.

SUMMARY OF THE INVENTION

Therefore, the primary object of the present invention is to prepare a patterned surface for a micro Fresnel lens by linear scanning without relying upon circularly deflected scanning that causes various defects of the type described above.

According to the present invention, there is provided a process for producing a micro Fresnel lens comprising the following steps: moving either a substrate coated with a resist layer for providing the micro Fresnel lens or a source of actinic radiation such as electron beam for exposing said resist layer relative to each other in a fixed direction; scanning linearly the resist coat with the actinic radiation in a direction perpendicular to the direction of said relative movement; during said scanning operation, performing exposure to the actinic radiation or interrupting or overlapping the application of said actinic radiation so as to form a latent image in an area corresponding to the grooved surface of the micro Fresnel lens within a predetermined width; repeating the above procedures in a direction perpendicular to that of the relative movement of said substrate and the source of actinic radiation; and developing the exposed resist layer to provide a micro Fresnel lens having the desired grooved surface.

BRIEF DESCRIPTION OF THE INVENTION

FIGS. 1 to 3 illustrate the concept of micro Fresnel lenses, in which FIG. 1 is a plan view, FIG. 2 is a cross section of a lens having concentric rings of a rectangular cross section, and FIG. 3 is a cross section of a lens having concentric rings of a sawtoothed cross section;

Figure 1:
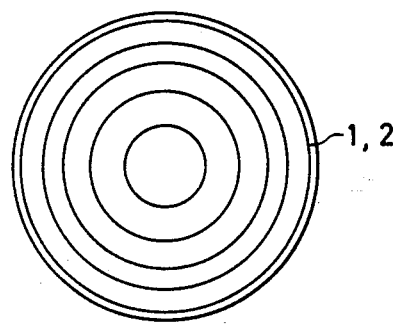
Figure 2:
Figure 3:
Figure 4:
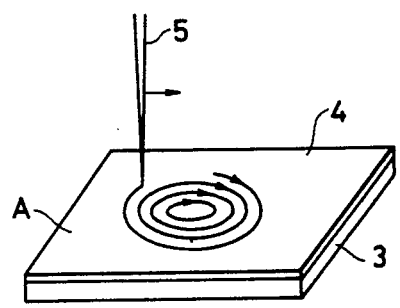
FIG. 4 shows how a photoresist layer is exposed to prepare a micro Fresnel lens.
Figure 5A:
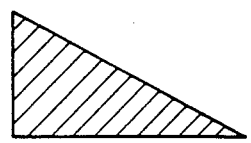
Figure 5B:
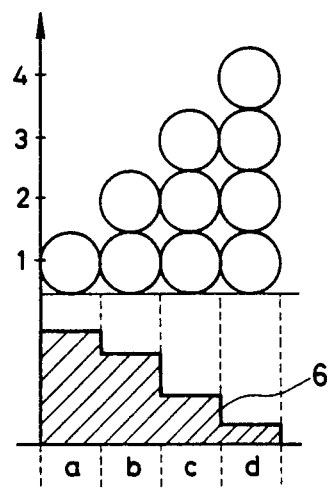
Figure 5C:
Figure 6:
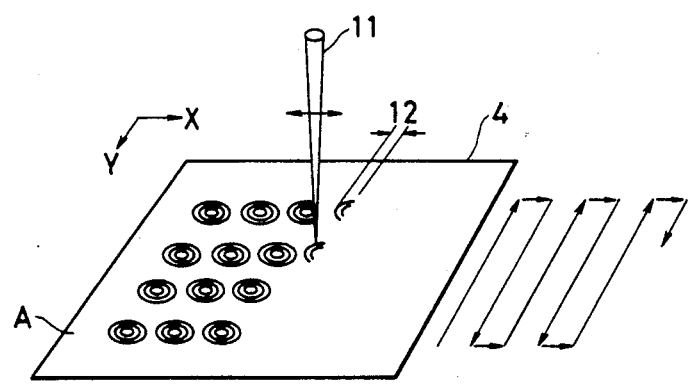
Figure 7:
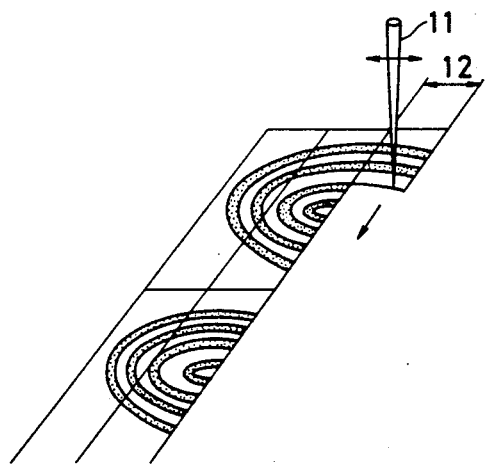
Figure 8A:
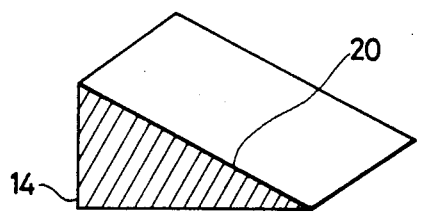
Figure 8B:
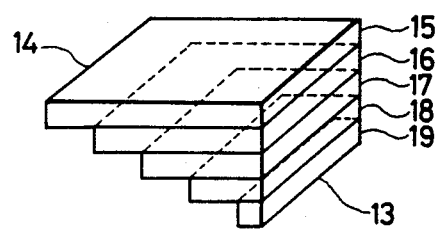
Figure 8C:
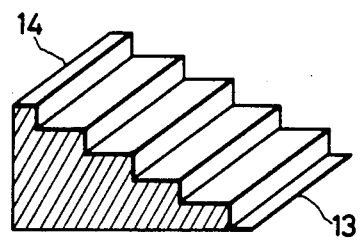

FIGS. 5(A) to 5(C) illustrate how a sawtoothed setback is formed by electron beam exposure of the photoresist layer;

FIGS. 6 to 9 show one embodiments of the method of the present invention, in which FIG. 6 shows the basic concept of scanning with an electron beam according to the present invention;

FIG. 7 is an enlarged view of FIG. 6;

FIGS. 8(A)–(C) illustrates how a sawtoothed setback is formed in the present invention, and FIG. 9 illustrates a cross section of a series of concentric ring bands.

DETAILED DESCRIPTION OF THE PREFERRED EMBODIMENTS

An embodiment of the process of the present invention that performs exposure with an electron beam by raster scanning is hereunder described by reference to FIGS. 6 to 9. Two diagrams illustrating the concept of linear scanning according to the present invention are shown in FIGS. 6 and 7, wherein the resist layer 4 is scanned with an electron beam 11 that moves by a width 12 in the X-direction. The substrate A having the resist layer 4 is moved in the Y-direction. The electron beam 11 scans the resist layer 4 five times on substantially the same line, and during this scanning duration, the electron beam is switched on and off the required number of times.

A method of providing a setback having a sawtoothed cross section by the electron beam exposure method of the present invention is shown in FIGS. 8(A) to 8(C). FIG. 8(A) shows part of a ring band having the idealized sawtoothed cross section. A schematic diagram of the area to be exposed by electron beam is shown in FIG. 8(B), wherein the exposure area has a common terminating end on the outer boundary 13 of the ring band, and scanning starts with the inner boundary 14 and proceeds outwardly in a staggered manner defining a first layer 15, a second layer 16, a third layer 17, a fourth layer 18 and a fifth layer 19. While the exposure area shown in FIG. 8(B) consists of five layers, as many layers as are necessary for providing the idealized sawtoothed setback having a smooth slope 20 may be used.

Figure 8D:
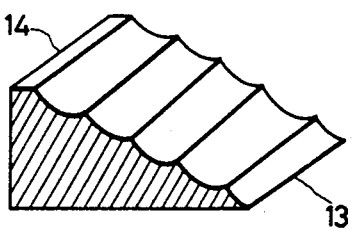

FIG. 8(C) shows a stepped variation in the thickness of the resist layer that is to be left intact after development, and this stepped variation is obtained by changing the dose of electron beam. Upon development, a setback having a cross section which is very close to the idealized sawtoothed shape can be obtained as shown in FIG. 8(D).

FIG. 9 shows a cross section of a series of concentric ring bands having different widths. In order to prepare such rings, the electron beam 11 is linearly deflected in a fixed direction, or the X-direction in FIG. 6, and the resist layer is scanned by moving the electron beam 11 which is a deflection width 12 and by turning on and off the beam according to prestored pattern data. The substrate A is continuously moved in the Y-direction (FIG. 6) and thereafter, is moved stepwise in the X-direction, and this sequence is repeated until the complete pattern is described on the resist layer 4.

As will be better understood by referring to FIG. 7, the method of the present invention does not cause the electron beam to scan the entire circumference of one concentric ring after another. Instead, all the concentric ring bands within the width 12 are scanned by successive linear deflections before the substrate A is moved by width 12 in the X-direction for starting another scanning of the ring bands. Stated more specifically, an exposure area (pattern data) comprising five layers 15 to 19 forming the slope 20 is first prepared by CAD technique. Scanning with an electron beam starts with the first layer 15 of each of the ring bands having different widths as shown in FIG. 9, and after completion of the scanning of this first layer, exposure of underlying layers 16 to 19 is performed by successive scanning. The exposure dose of the electron beam for each layer is so determined that by exposure of the five overlapping layers, the thickness of the resist layer that is to be left intact after development is zero. Therefore, the resist layer, when it is developed subsequently, should provide a stepped cross section as shown in FIG. 8(C) according to the difference in the exposure dose of electron beam. However, due to the uneven intensity of the spot of electron beam across its diameter and other factors, the actual cross section of each ring band looks more like the idealized sawtoothed shape with a smooth slope as shown in FIG. 8(D).

In the foregoing embodiment, the exposure method of the present invention is implemented by the raster scanning of an electron beam. But it should be understood that the same result can be obtained by any other techniques that are commonly employed in the fabrication of IC or LSI photomasks or in the direct exposure of silicon wafers. Other suitable techniques include vector scanning using a circular spot of electron beam, variable shaped beam scanning that performs area exposure with a rectangular beam, and variable shaped beam raster scanning that effects raster scanning with a variable shaped beam. Whichever technique is used, circularly deflected scanning should be avoided and an exposure area consisting of a plurality of layers should be linearly scanned with an electron beam.

The photoresist used in the embodiment shown above is positive-acting and that area illuminated with an electron beam is dissolved out by a developer. Alternatively, a negative-acting photoresist the exposed part of which is left intact after development may be used. If a negative-acting resist is used, the finally obtained setbacks on the substrate have a slope inclining in the opposite direction to that obtained by using a positive-acting resist, and therefore, the pattern data to be used with a negative-acting resist should be prepared in the direction opposite to that used in the above embodiment.

As shown above, the method of the present invention does not use the technique of circularly deflected scanning. Therefore, the conventional electron beam exposure equipment used in the fabrication of IC or LSI photomasks or in the direct exposure of silicon wafers can be used with the method of the present invention for the reason that the equipment performs linear scanning with an electron beam. By accomplishing multiple exposure with this equipment, the method of the present invention ensures the production of a micro Fresnel lens which has concentric rings of a sawtoothed cross section and which hence achieves high light concentration efficiency. Since the conventional electron beam exposure equipment provides a large exposure area, not only can a lens having a larger aperture be prepared but also a plurality of lens patterns which may be the same or different can be formed on the same substrate. As a further advantage, pattern data consisting of a plurality of layers can be prepared by CAD technique, so multiple exposure can be accomplished by following the same procedure as used in the fabrication of a photomask.

We claim:

1. A process for producing a micro Fresnel lens having a grooved surface from a substrate coated with a resist layer comprising the following steps:
   moving a substrate coated with a resist layer in a first direction relative to a source of actinic radiation:
   scanning said actinic radiation linearly in a direction perpendicular to said first direction on said resist coat within a first predetermined width while interrupting and overlapping application of said actinic radiation to form a latent image of a portion of a micro Fresnel lens within said first predetermined width;
   indexing said substrate with respect to said source of actinic radiation to scan a second portion of said substrate adjacent said first predetermined width in the form of a second predetermined width;
   repeating said scanning and indexing steps until the entire latent image of said lens is formed; and
   developing the exposed resist layer to form the grooved surface of said Fresnel lens.

2. The process of claim 1, wherein said actinic radiation comprises electron beam.

3. A process for producing a micro Fresnel lens having a grooved surface from a substrate coated with a resist layer comprising the following steps:
   moving a substrate coated with a resist layer in a fixed direction relative to a source of actinic radiation;
   scanning linearly the resist coat with the actinic radiation in a direction perpendicular to the direction of the movement of the substrate;
   during said scanning, exposing the coated substrate to the actinic radiation, interrupting, and overlapping the application of said actinic radiation so as to form a latent image in an area corresponding to the grooved surface of the micro Fresnel lens within a predetermined width;

repeating the above procedures in a direction perpendicular to that of the movement of said substrate; and developing the exposed resist layer to provide a micro Fresnel lens having the grooved surface.

4. A process for producing a micro Fresnel lens having a grooved surface from a substrate coated with a resist layer comprising the following steps:

moving, in a fixed direction, a source of actinic radiation for exposing a resist layer relative to a substrate coated with said resist layer for providing the micro Fresnel lens;

scanning linearly the resist coat with the actinic radiation in a direction perpendicular to the direction of the movement of said source of actinic radiation;

during said scanning, exposing the coated substrate to the actinic radiation, interrupting and overlapping the application of said actinic radiation so as to form a latent image in an area corresponding to the grooved surface of the micro Fresnel lens within a predetermined width;

repeating the above procedures in a direction perpendicular to that of the movement of said source of actinic radiation; and developing the exposed resist layer to provide a micro Fresnel lens having the grooved surface.

* * * * *